United States Patent
Wagoner et al.

(10) Patent No.: US 9,002,265 B2
(45) Date of Patent: Apr. 7, 2015

(54) METHOD, SYSTEM AND APPARATUS FOR GALVANIC ISOLATION OF GATE-CONTROLLED DEVICES

(75) Inventors: Robert Gregory Wagoner, Roanoke, VA (US); Robert Allen Seymour, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 193 days.

(21) Appl. No.: 13/558,864

(22) Filed: Jul. 26, 2012

(65) Prior Publication Data
US 2014/0030984 A1    Jan. 30, 2014

(51) Int. Cl.
*H04B 5/00*     (2006.01)
*H03K 17/689*   (2006.01)

(52) U.S. Cl.
CPC .................................. *H03K 17/689* (2013.01)

(58) Field of Classification Search
USPC ............................ 455/39, 41.1–41.3, 73, 130
See application file for complete search history.

(56) References Cited

U.S. PATENT DOCUMENTS

| | | | |
|---|---|---|---|
| 7,253,602 B2 | 8/2007 | Shvach et al. | |
| 7,417,554 B2 | 8/2008 | Benke et al. | |
| 7,565,253 B2 | 7/2009 | Ewers et al. | |
| 8,493,893 B2 * | 7/2013 | Morong ........................ | 370/276 |
| 2008/0129238 A1 | 6/2008 | Andersen | |
| 2009/9018476 | 7/2009 | Hauenstein | |
| 2009/0226154 A1 | 9/2009 | Thomas et al. | |
| 2010/0270983 A1 * | 10/2010 | Gong et al. ................... | 320/167 |
| 2011/0140512 A1 | 6/2011 | Pino et al. | |
| 2012/0033392 A1 | 2/2012 | Golubovic et al. | |
| 2013/0135030 A1 * | 5/2013 | Barrenscheen et al. ...... | 327/355 |

FOREIGN PATENT DOCUMENTS

| | | |
|---|---|---|
| EP | 0661862 A1 | 7/1995 |
| EP | 2 001 104 A2 | 10/2008 |

* cited by examiner

*Primary Examiner* — Tuan H Nguyen
(74) *Attorney, Agent, or Firm* — Dority & Manning, P.A.

(57) ABSTRACT

In one aspect, a method of galvanic isolation for a gate-controlled device is described. One embodiment of the method comprises receiving, by a gate-controlled device, wireless receive signals, wherein said wireless receive signals are received by a wireless receiver associated with the gate-controlled device.

17 Claims, 6 Drawing Sheets

Receiving, By A Gate-controlled Device, Wireless Receive Signals, Wherein The Wireless Receive Signals Are Received By A Wireless Receiver Associated With The Gate-controlled Device
602

FIG. 6A

Receiving, By A Gate-controlled Device, Wireless Control Signals, Wherein The Wireless Control Signals Are Received By A Wireless Transceiver Associated With The Gate-controlled Device
604

Controlling The Gate-controlled Device In Accordance With The Received Wireless Control Signals
606

Transmitting Wireless Transmit Signals By The Gate-controlled Device, Wherein The Wireless Transmit Signals Are Transmitted By The Wireless Transceiver Associated With The Gate-controlled Device
608

FIG. 6B

METHOD, SYSTEM AND APPARATUS FOR GALVANIC ISOLATION OF GATE-CONTROLLED DEVICES

BACKGROUND OF THE INVENTION

The subject matter described herein relates generally to power systems and, more particularly, to galvanic isolation of gate-controlled devices used in power systems.

In some known renewable energy power systems, direct current (DC) electrical power is generated from at least one renewable energy source or generated alternating current (AC) electrical power is inverted to DC electrical power and then converted back to AC. Such renewable energy sources may include wind, solar, geothermal, hydro, biomass, and/or any other renewable energy source. To properly couple such power systems to an electrical grid, the DC electrical power must be converted to AC. At least some known power systems use a power converter to convert DC power to AC power. In some instances, the converter can be a parallel converter.

In many instances, power converters use gate-controlled devices such as, for example, insulated gate bipolar transistors (IGBT), injection-enhanced gate transistors (IEGT), silicon controlled rectifiers (SCR), gate turn off (GTO) thyristors, gate controlled thyristors (GCT), integrated gate commutated thyristors (IGCT), metal-oxide semiconductor field effect transistor (MOSFET), and the like. Generally, control signals to these gate-controlled devices and signals transmitted by the gate-controlled devices are required to be isolated from the electrical system that they are a part of and/or from electromagnetic interference in order to provide accurate signaling. Galvanic isolation is a term that describes a method of electrical isolation between sections of electrical systems. Gate-controlled devices ordinarily utilize a transformer as the galvanic isolation method to deliver the power to the gate drive circuitry of the gate-controlled device, and gate-controlled devices ordinarily utilize a signal isolated by light (such as fiber optic or optocoupler) as the galvanic isolation method to deliver the control signals to/from the gate drive circuitry. The galvanic isolation of the control signals utilizing fiber optic or optocoupler is expensive, and has limitations in terms of a tradeoff of the cost vs. performance analysis. For example an optocoupler usually has a voltage limitation making it impractical for high voltage isolation, and in contrast, fiber optics are capable of high voltage isolation but at a higher cost.

Described herein are embodiments of methods, apparatus and systems for the galvanic isolation of the control signals to and from a gate-controlled device that overcome challenges in the art, some of which are described above.

BRIEF DESCRIPTION OF THE INVENTION

In one aspect, a method of galvanic isolation for a gate-controlled device is described. One embodiment of the method comprises receiving, by a gate-controlled device, wireless receive signals, wherein said wireless receive signals are received by a wireless receiver associated with the gate-controlled device.

In another aspect, an embodiment of an apparatus for galvanic isolation for an insulated gate bipolar transistor (IGBT) is described. This embodiment of an apparatus comprises an IGBT and a wireless transceiver associated with the IGBT. The wireless transceiver is configured to receive wireless control signals; and transmit wireless transmit signals.

In yet another aspect, a system of galvanic isolation for a gate-controlled device is described. One embodiment of the system comprises at least one gate-controlled device; a first wireless transceiver associated with the at least one gate-controlled device; a control card; and a second wireless transceiver associated with the control card, wherein wireless control signals transmitted by the second wireless transceiver from the control card are received by the first wireless transceiver and used to control the gate-fired device and wherein wireless transmit signals are transmitted by the first wireless transceiver and received by the second wireless transceiver.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

Wherever possible, the same reference numbers will be used throughout the drawings to represent the same parts.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As described herein, a power generation system includes a power converter system and at least one power generation unit. The power generation unit can be a renewable energy power generation unit that generates power from a renewable energy source. Such renewable energy sources may include wind, solar, geothermal, hydro, biomass, and/or any other renewable energy source. The power converter system can include a converter coupled to the power generation unit, and an inverter coupled to the converter by a DC bus. The inverter is coupled to an electrical distribution network for supplying electrical energy to the network. A control system controls the operation of the converter and the inverter. The inverter can be a poly-phase apparatus. For example, the inverter can include three inverter phases, each phase including a plurality of parallel bridges. Each bridge can be comprised of two or more switches coupled together in series. In many instances, these switches can be comprised of one or more gate-controlled devices such as, for example, insulated gate bipolar transistors (IGBT), injection-enhanced gate transistors (IEGT), silicon controlled rectifiers (SCR), gate turn off (GTO) thyristors, gate controlled thyristors (GCT), integrated gate commutated thyristors (IGCT), metal-oxide semiconductor field effect transistor (MOSFET), and the like. The control system can control each of the gate-controlled devices.

Figure 1:
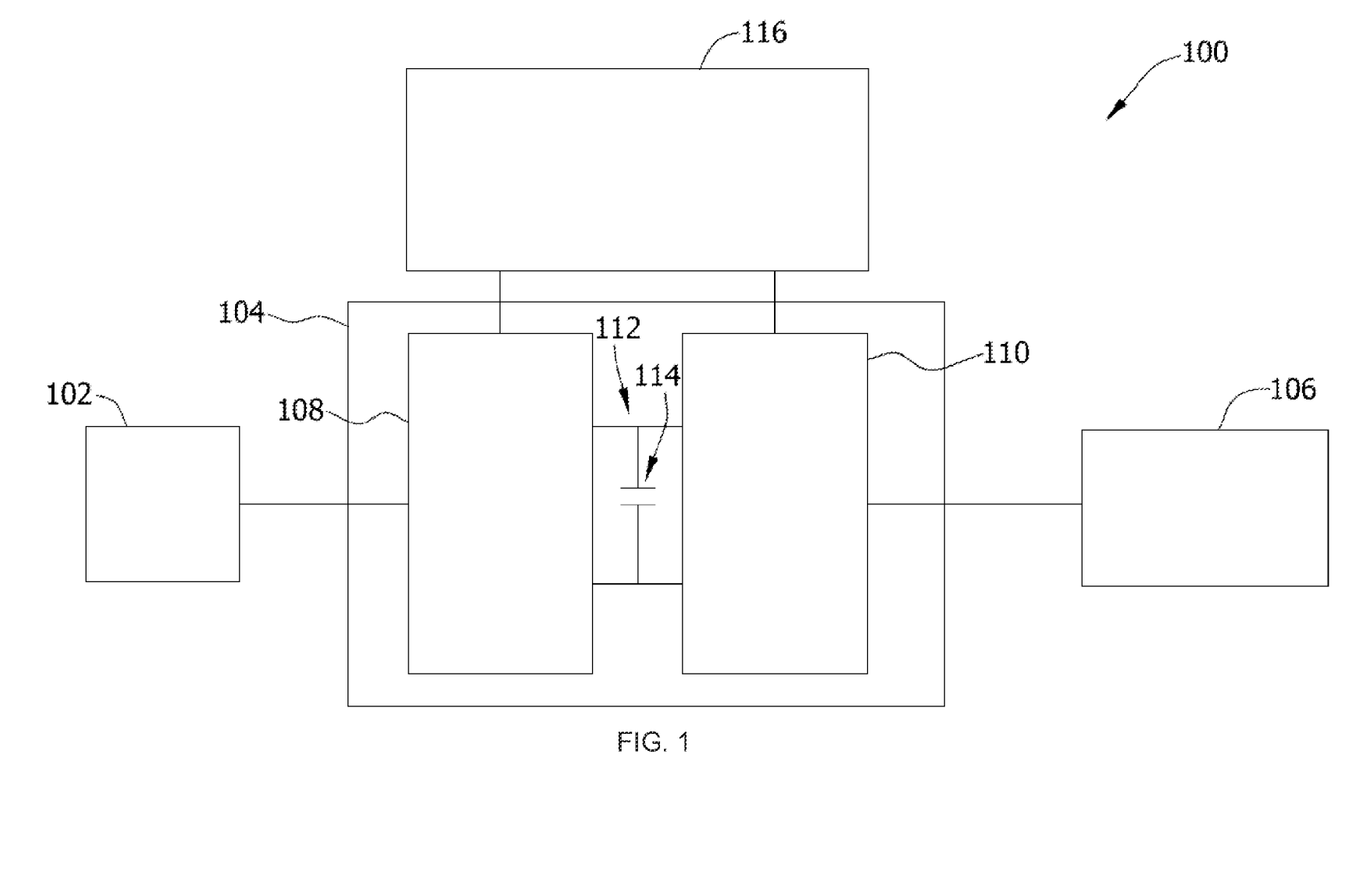
FIG. 1 is a schematic diagram of an exemplary power generation system.

FIG. 1 is a schematic diagram of an exemplary power generation system 100 that includes at least one power generation unit 102. Power generation unit 102 includes a wind turbine, a solar panel or array, a fuel cell, a geothermal generator, a hydropower generator, and/or any other device that generates electrical power. More specifically, in the exemplary embodiment, power generation unit 102 can be a device that generates direct current (DC) electrical power from at least one renewable energy source. Alternatively, power generation unit 102 is a gas turbine, a steam turbine, and/or any other device that generates DC or alternating current (AC) power from a renewable or non-renewable energy source.

In the exemplary embodiment, power generation unit 102 is coupled to a power converter system 104, or a power converter 104. DC power generated by power generation unit 102 is transmitted to power converter system 104, and power converter system 104 converts the DC power to AC power. The AC power is transmitted to an electrical distribution network 106, or "grid." Power converter system 104, in the exemplary embodiment, adjusts an amplitude of the voltage and/or current of the converted AC power to an amplitude suitable for electrical distribution network 106, and provides AC power at a frequency and a phase that are substantially equal to the frequency and phase of electrical distribution network 106. Moreover, in the exemplary embodiment, power converter system 104 provides three phase AC power to electrical distribution network 106. Alternatively, power converter system 104 provides single phase AC power or any other number of phases of AC power to electrical distribution network 106.

In the exemplary embodiment, power converter system 104 includes a DC to DC, or "boost," converter 108 and an inverter 110 coupled together by a DC bus 112. Alternatively, power converter system 104 may include an AC to DC converter 108 for use in converting AC power received from power generation unit 102 to DC power, and/or any other converter 108 that enables power converter system 104 to function as described herein. In one embodiment, power converter system 104 does not include converter 108, and inverter 110 is coupled to power generation unit 102 by DC bus 112 and/or by any other device or conductor. In the exemplary embodiment, inverter 110 is a DC to AC inverter 110 that converts DC power received from converter 108 into AC power for transmission to electrical distribution network 106. Moreover, in the exemplary embodiment, DC bus 112 includes at least one capacitor 114. Alternatively, DC bus 112 includes a plurality of capacitors 114 and/or any other electrical power storage devices that enable power converter system 104 to function as described herein. As current is transmitted through power converter system 104, a voltage is generated across DC bus 112 and energy is stored within capacitors 114.

Figure 2:
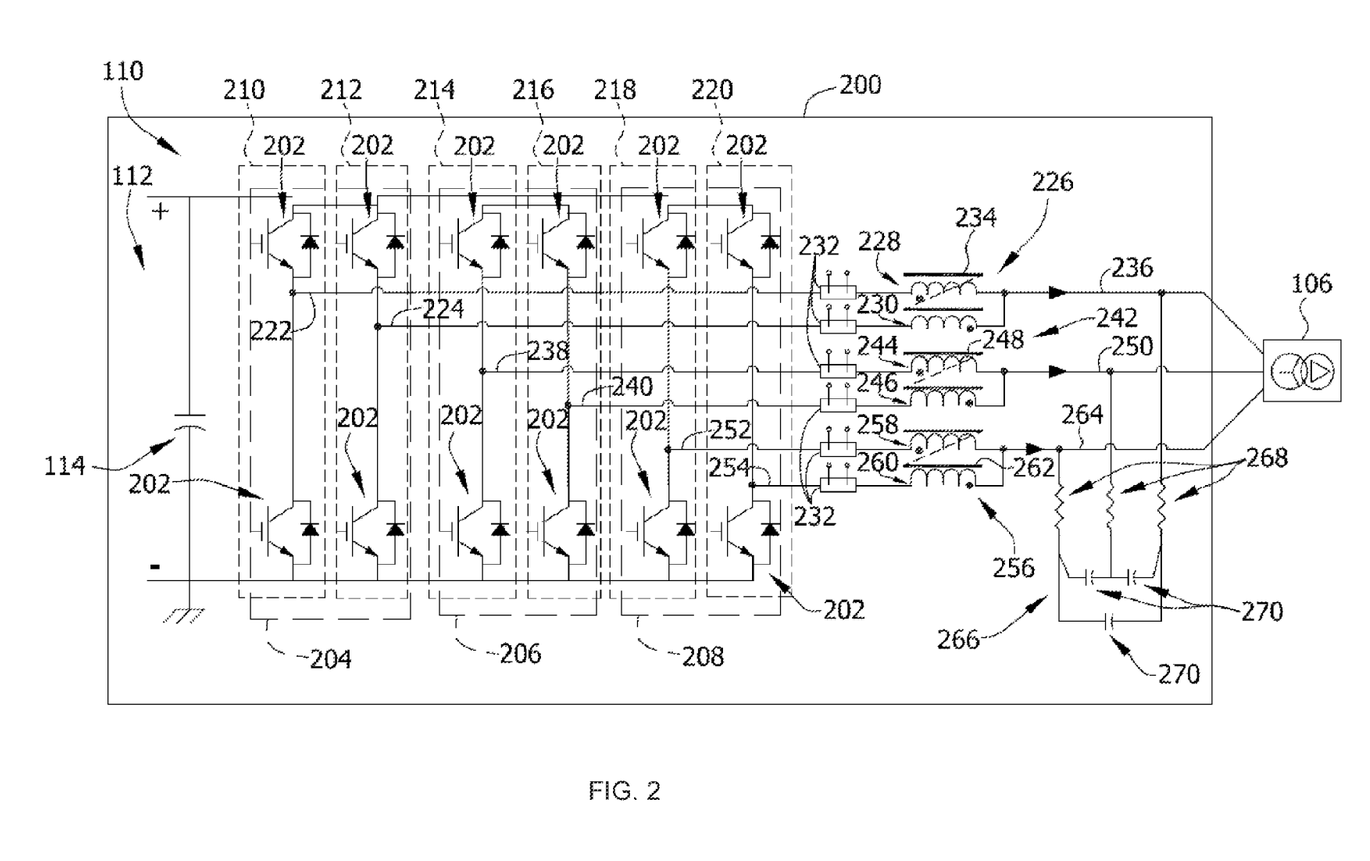
FIG. 2 is a schematic diagram of a portion of an exemplary power converter system that may be used with power generation system (shown in FIG. 1) that may benefit from embodiments of the present invention.

Power converter system 104 includes a control system 116 coupled to converter 108 and/or to inverter 110. In the exemplary embodiment control system 116 includes and/or is implemented by at least one processor. As used herein, the processor includes any suitable programmable circuit such as, without limitation, one or more systems and microcontrollers, microprocessors, reduced instruction set circuits (RISC), application specific integrated circuits (ASIC), programmable logic circuits (PLC), field programmable gate arrays (FPGA), and/or any other circuit capable of executing the functions described herein. The above examples are exemplary only, and thus are not intended to limit in any way the definition and/or meaning of the term "processor." FIG. 2 is a schematic diagram of a portion of an exemplary power converter system 200 that may be used with power generation system 100 (shown in FIG. 1) that may benefit from embodiments of the present invention. In the exemplary embodiment, inverter 110 includes four inverter switches 202 coupled together for each phase of electrical power that power converter system 200 produces. Alternatively, inverter 110 includes any suitable number of inverter switches 202 for each phase of electrical power that enables inverter 110 and/or power converter system 200 to function as described herein. In the exemplary embodiment, inverter switches 202 are insulated gate bipolar transistors (IGBTs). Alternatively, inverter switches 202 are any other suitable transistor or any other suitable switching device.

In the exemplary embodiment, inverter 110 includes a first inverter phase 204, a second inverter phase 206, and a third inverter phase 208. First inverter phase 204 provides AC power corresponding to a first phase of electrical distribution network 106, second inverter phase 206 provides AC power corresponding to a second phase of electrical distribution network 106, and third inverter phase 208 provides AC power corresponding to a third phase of electrical distribution network 106. Moreover, in the exemplary embodiment, first inverter phase 204 includes a first phase first bridge 210 and a first phase second bridge 212. Each of first phase first bridge 210 and first phase second bridge 212 includes two inverter switches 202 coupled together in series. The series-coupled inverter switches 202 of first phase first bridge 210 are coupled in parallel with the series-coupled inverter switches 202 of first phase second bridge 212 (i.e., first phase first bridge 210 is coupled in parallel with first phase second bridge 212).

Each of second inverter phase 206 and third inverter phase 208 are configured in a similar manner to first inverter phase 204. Accordingly, second inverter phase 206 includes a second phase first bridge 214 coupled in parallel with a second phase second bridge 216, and third inverter phase 208 includes a third phase first bridge 218 coupled in parallel with a third phase second bridge 220. Each of second phase first bridge 214, second phase second bridge 216, third phase first bridge 218, and third phase second bridge 220 includes two inverter switches 202 coupled together in series. Alternatively, first inverter phase 204, second inverter phase 206, and/or third inverter phase 208 may include any suitable number and/or configuration of bridges and/or inverter switches 202.

In the exemplary embodiment, a first phase first conductor 222 is coupled between the two inverter switches 202 of first phase first bridge 210 and a first phase second conductor 224 is coupled between the two inverter switches 202 of first phase second bridge 212. First phase first conductor 222 transmits current from first phase first bridge 210 to a first inductor 226 that includes a first winding 228 and a second winding 230. As used herein, a "winding" includes at least one conductor arranged in one or more loops or "turns" such that the winding is substantially shaped as a coil.

In the exemplary embodiment, first phase first conductor 222 is coupled to first winding 228 of first inductor 226. A current sensor 232 is coupled to first phase first conductor 222 for use in measuring the current transmitted through conductor 222 and through first winding 228. First phase second conductor 224 transmits current from first phase second bridge 212 to second winding 230. A current sensor 232 is coupled to first phase second conductor 224 for use in measuring the current transmitted through conductor 224 and through second winding 230. Moreover, first winding 228 and second winding 230 are positioned about a common inductor core 234 such that first winding 228 and second winding 230 are magnetically coupled to inductor core 234 when current is transmitted through first winding 228 and second winding 230.

While FIG. 2 illustrates inductor core 234 separated into two components, this is merely for clarity of illustration. In the exemplary embodiment, inductor core 234 can be a single continuous metal or metallic structure, and first winding 228 and second winding 230 can be positioned about separate sections or portions of inductor core 234. As such, the dotted lines shown in FIG. 2 indicate that each section of inductor core 234 is connected to, and formed integrally with, each other section. An output of first winding 228 and an output of second winding 230 are coupled to a first phase output conductor 236 that transmits current from first winding 228 and second winding 230 to electrical distribution network 106.

A second phase first conductor 238 is coupled between the two inverter switches 202 of second phase first bridge 214 and a second phase second conductor 240 is coupled between the two inverter switches 202 of second phase second bridge 216. Second phase first conductor 238 transmits current from second phase first bridge 214 to a second inductor 242 that includes a first winding 244 and a second winding 246. More specifically, second phase first conductor 238 is coupled to first winding 244 of second inductor 242. A current sensor 232 is coupled to second phase first conductor 238 for use in measuring the current transmitted through conductor 238 and through first winding 244. Second phase second conductor 240 transmits current from second phase second bridge 216 to second winding 246. A current sensor 232 is coupled to second phase second conductor 240 for use in measuring the current transmitted through conductor 240 and through second winding 246. Moreover, first winding 244 and second winding 246 are positioned about a common inductor core 248 such that first winding 244 and second winding 246 are magnetically coupled to inductor core 248 when current is transmitted through first winding 244 and second winding 246. An output of first winding 244 and an output of second winding 246 are coupled to a second phase output conductor 250 that transmits current from first winding 244 and second winding 246 to electrical distribution network 106.

In the exemplary embodiment, a third phase first conductor 252 is coupled between the two inverter switches 202 of third phase first bridge 218 and a third phase second conductor 254 is coupled between the two inverter switches 202 of third phase second bridge 220. Third phase first conductor 252 transmits current from third phase first bridge 218 to a third inductor 256 that includes a first winding 258 and a second winding 260. More specifically, third phase first conductor 252 is coupled to first winding 258 of third inductor 256. A current sensor 232 is coupled to third phase first conductor 252 for use in measuring the current transmitted through conductor 252 and through first winding 258. Third phase second conductor 254 transmits current from third phase second bridge 220 to second winding 260. A current sensor 232 is coupled to third phase second conductor 254 for use in measuring the current transmitted through conductor 254 and through second winding 260. Moreover, first winding 258 and second winding 260 are positioned about a common inductor core 262 such that first winding 258 and second winding 260 are magnetically coupled to inductor core 262 when current is transmitted through first winding 258 and second winding 260. An output of first winding 258 and an output of second winding 260 are coupled to a third phase output conductor 264 that transmits current from first winding 258 and second winding 260 to electrical distribution network 106.

Figure 3:
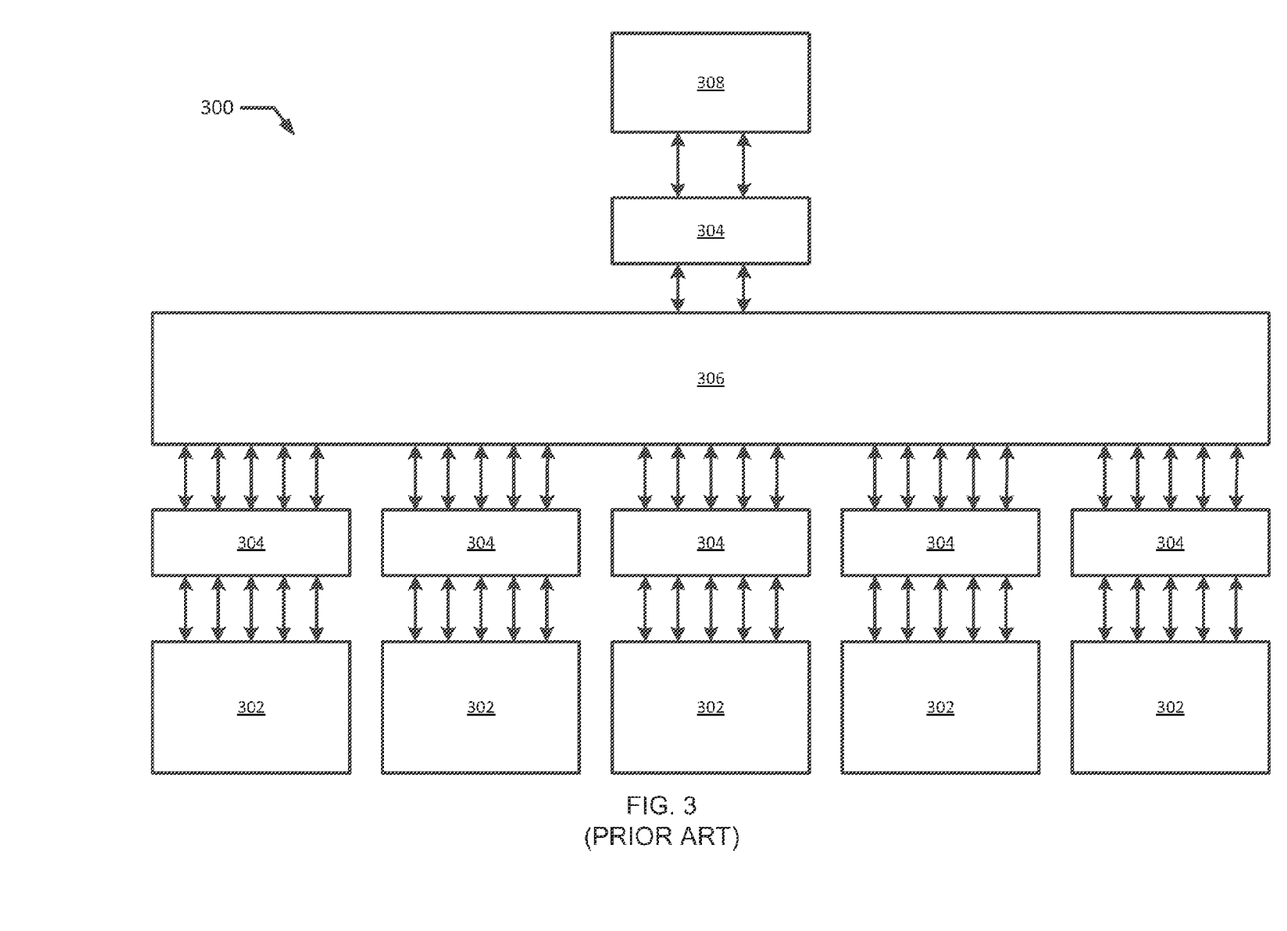
FIG. 3 illustrates a prior art converter system utilizing gate-controlled devices having signals isolated by light (such as fiber optic or optocoupler) as the galvanic isolation method to deliver the control signals to/from the gate drive circuitry.

Referring back to FIG. 1, control system 116 can include one or more control cards (not shown in FIG. 1) for interfacing with various components of power generation system 100. For example, the one or more control cards can interface with one or more gate-controlled devices such as switches 202 (FIG. 2) to send control signals to the gate-controlled devices and to receive condition or status signals from the gate-controlled devices. Generally, signals to and from the gate-controlled devices are galvanically isolated. For example, FIG. 3 illustrates a prior art converter system 300 utilizing gate-controlled devices 302 having signals isolated by light (such as fiber optic or optocoupler) 304 as the galvanic isolation method to deliver the control signals to/from the gate drive circuitry. In this example there are five gate-controlled devices 302, each gate-controlled device 302 having five signals galvanically isolated with light from the main control card 306, and another control card 308 galvanically isolated with light from the main control card 306, for a total of 27 separate control signals galvanically isolated with light from the main control card 306. However this is just an example converter system, and other converter systems may have more or less signals galvanically isolated with light. While the system 300 shown in FIG. 3 may be effective, the optocouplers 304 add additional equipment and costs to the system 300 as well as potential failure points. Furthermore, each gate-controlled device 302 must be "hard-wired" (e.g., electrically conductive wiring and/or fiber optic cable) from the gate-controlled device 302 to the control card 306, which may be difficult, expensive and add time to the installation process. The main control card 306 must also be optically isolated and "hard-wired" to any other control cards 308.

Figure 4:
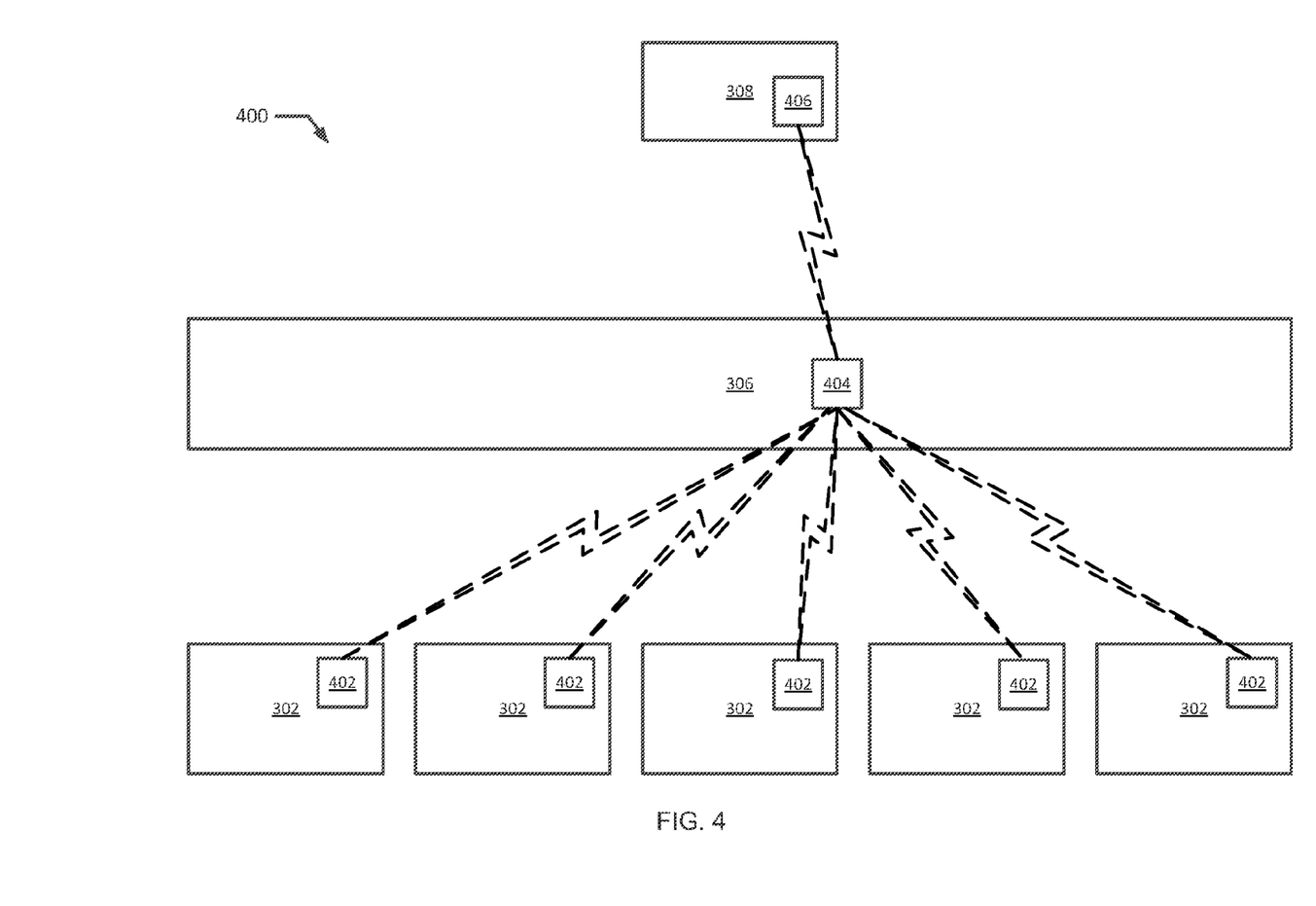
FIG. 4 illustrates an exemplary converter system utilizing gate-controlled devices with control signals isolated by wireless receivers and transmitters, generally embodied as transceivers.

Described herein are embodiments of methods and systems of galvanic isolation for control signals used for a gate-controlled device utilizing a wireless communication method such as those used in ordinary mobile cellular phones. FIG. 4 illustrates an exemplary converter system 400 utilizing gate-controlled devices 302 with control signals isolated by wireless receivers and transmitters, generally embodied as transceivers 402. Mobile cellular phones use various digital modulation schemes, with standard chipsets produced in very high volumes. The technology of mobile cellular phones has advanced at this time to provide very low cost chipsets for wireless communication, with nominal data rates between 100 Mbit/s and 1 Gigabit/s. These low-cost chipsets combined with algorithms designed to transfer information and extract that information in very noisy environments can be used to provide galvanic isolation for control signals used for a gate-controlled devices 302.

Ordinary mobile cellular phones available today utilize channel access methods that allow several transmitters to send information simultaneously over a single communication channel, allowing several users to share a band of frequencies. These channel access methods can include, for example, frequency division multiple access (FDMA), time-division multiple access (TDMA), spread-spectrum multiple access (SSMA), space-division multiple access (SDMA), and derivatives and/or variants of each. For example, code division multiple access (CDMA) is a type of SSMA channel access method used by ordinary mobile cellular phones. CDMA utilizes spread-spectrum technology and a special coding scheme to allow multiple signals to be multiplexed over the same physical channel. CDMA effectively rejects narrow band interference, and is resistant to multipath interference.

FIG. 4 illustrates a system 400 for galvanic isolation for a gate-controlled device 302. One embodiment of the system 400 comprises at least one gate-controlled device 302, a first wireless transceiver 402 associated with the at least one gate-controlled device 302; a control card 306; and a second wireless transceiver 404 associated with the control card 306. Wireless control signals transmitted by the second wireless transceiver 404 from the control card 306 are received by the first wireless transceiver 402 and used to control the gate-fired device 302 and wherein wireless transmit signals are transmitted by the first wireless transceiver 402 and received by the second wireless transceiver 402. Embodiments of the system 400 may optionally comprise one or more additional control cards 308 having a third wireless transceiver 406 associated with the one or more additional control cards. The third wireless transceiver 406 may communicate with the second wireless transceiver of the main control card 404 and/or with the first wireless transceiver 402 associated with the gate-controlled device 302. In one aspect, separate receivers and transmitters may replace one or more of the wireless transceivers 402, 404, 406. Therefore, as used herein, "wireless transceiver" is intended to encompass a singular device that operates as a radio frequency (RF) receiver and transmitter or a separate RF receiver and a separate RF transmitter that are associated with a single device such as a gate-controlled device 302. In one aspect, one or more of the first wireless transceiver 402 and/or the third wireless transceiver 406 may be replaced with a wireless receiver if there is no need for bi-lateral communication between the control card 306 and the gate-controlled device 302 or the additional control card 308, respectively. In various embodiments, the gate-controlled device 302 can include an insulated gate bipolar transistor (IGBT), injection-enhanced gate transistor (IEGT), silicon controlled rectifier (SCR), gate turn off (GTO) thyristor, gate controlled thyristor (GCT), integrated gate commutated thyristor (IGCT), or metal-oxide semiconductor field effect transistor (MOSFET), and the like, or combinations thereof if there are a plurality of gate-controlled devices 302. In various aspects, the wireless transmit signals transmitted from the gate-controlled device 302 can comprise one or more of voltage sensing, temperature sensing, current sensing, desaturation sensing signals and the like. In one aspect, the wireless transceivers such as the first wireless transceiver 402, the second wireless transceiver 404 and the third wireless transceiver 406 transmit and receive signals using digital wireless technology including code division multiple access (CDMA) as a channel access method. In other aspects, the wireless transceivers 402, 404, 406 may use frequency division multiple access (FDMA), time-division multiple access (TDMA), spread-spectrum multiple access (SSMA), space-division multiple access (SDMA), and derivatives and/or variants of each as the channel access method.

As shown in FIG. 4, in one aspect the gate-controlled device 302 comprises an IGBT. The IGBT with an associated wireless transceiver 402 can comprise an apparatus for galvanic isolation of the IGBT. The wireless transceiver can be configured to receive wireless control signals; and transmit wireless transmit signals.

In some instances, such as the use of the wireless transceivers 402, 404, 406 in a power generation facility such as, for example, a wind turbine generator, the wireless transceivers 402, 404, 406 need shielding from interference such as electromagnetic interference (EMI). For example, if used in a wind turbine installation, the use of cellular technology chipsets may require avoiding interference to and from the ambient electromagnetic environment outside of the wind turbine. Most channel access methods are already required to adhere to strict standards and specifications developed by the wireless communications industry, and the EMI signature of the power conversion equipment is already designed with this in mind. In some instances, the crisp signature(s) associated with the carrier frequency (or frequencies) of the wireless transmissions described herein must be attenuated in order to meet codes and regulations.

Figure 5:
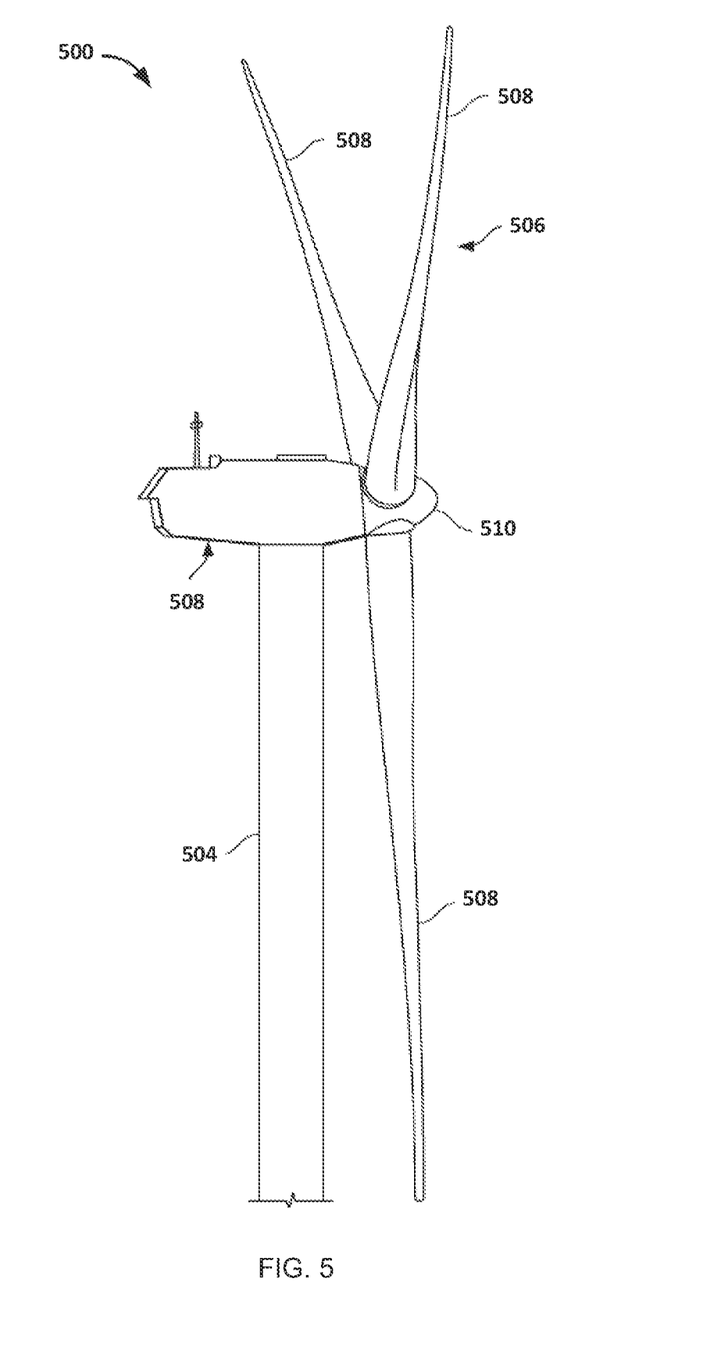
FIG. 5 is a schematic view of an exemplary wind turbine generator.

FIG. 5 is a schematic view of an exemplary wind turbine generator 500. The wind turbine 500 includes a nacelle 502 housing a generator (not shown in FIG. 5). Nacelle 502 is mounted on a mast 504 (a portion of mast 504 being shown in FIG. 5. Mast 504 may be any height that facilitates operation of wind turbine 500 as described herein. Wind turbine 500 also includes a rotor 506 that includes three rotor blades 508 attached to a rotating hub 510. Alternatively, wind turbine 500 includes any number of blades 508 that facilitate operation of wind turbine 500 as described herein. A typical location for a power converter for a wind turbine generator 500 that can benefit from embodiments of the present invention is near the base of the tower mast 504 of the wind turbine 500 shown in FIG. 5. For this typical location, both the metal cabinet of the power converter as well as the tower mast 504 structure can contribute to shield the high frequency energy of the wireless transmissions described herein to and from the outside world.

Figure 6A:
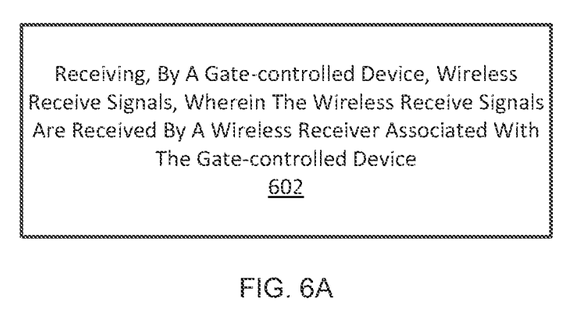
FIG. 6A is an exemplary flowchart illustrating an embodiment of a method of galvanic isolation for a gate-controlled device.

FIG. 6A is an exemplary flowchart illustrating an embodiment of a method of galvanic isolation for a gate-controlled device. The process comprises step 602, receiving, by a gate-controlled device, wireless receive signals, wherein said wireless receive signals are received by a wireless receiver associated with the gate-controlled device.

Figure 6B:
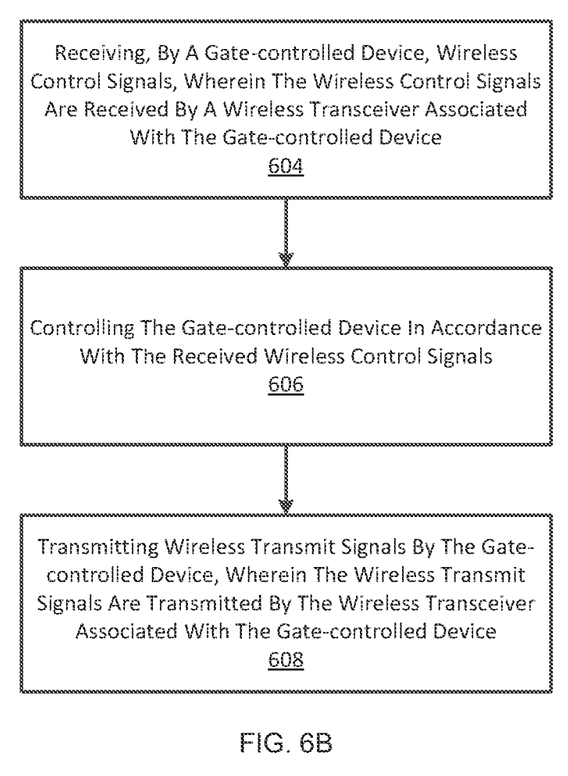
FIG. 6B is an exemplary flowchart illustrating another embodiment of a method of galvanic isolation for a gate-controlled device.

FIG. 6B is an exemplary flowchart illustrating another embodiment of a method of galvanic isolation for a gate-controlled device. The process comprises step 604, receiving, by a gate-controlled device, wireless control signals, wherein the wireless control signals are received by a wireless transceiver associated with the gate-controlled device. In various aspects, the gate-controlled device can includes an insulated gate bipolar transistor (IGBT), injection-enhanced gate transistor (IEGT), silicon controlled rectifier (SCR), gate turn off (GTO) thyristor, gate controlled thyristor (GCT), integrated gate commutated thyristor (IGCT), metal-oxide semiconductor field effect transistor (MOSFET), and the like. In one aspect, the wireless control signals are received from a main control card having a wireless transmitter. In one aspect, the wireless control signals are received by a wireless transceiver utilizing digital wireless technology such as CDMA, FDMA, TDMA, SSMA, and derivatives and/or variants of each as the channel access method, and the like. At step 606, the gate-controlled device is controlled in accordance with the received wireless control signals. At step 608, wireless transmit signals are transmitted by the gate-controlled device, wherein the wireless transmit signals are transmitted by the wireless transceiver associated with the gate-controlled device. In one aspect, the wireless transmit signals comprise one or more of voltage sensing, temperature sensing, current sensing, desaturation sensing signals, and the like. In one aspect, the wireless transmit signals are transmitted to a main control card having a wireless receiver. In one aspect, the wireless transmit signals are transmitted to a main control card having a wireless transceiver utilizing digital wireless technology such as CDMA, FDMA, TDMA, SSMA, and derivatives and/or variants of each as the channel access method, and the like.

A technical effect of the systems and methods described herein includes at least one of providing a solution to galvanically isolate control signals to a gate-controlled device, particularly in a power generation environment.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Although specific features of various embodiments of the invention may be shown in some drawings and not in others, this is for convenience only. In accordance with the principles of the invention, any feature of a drawing may be referenced and/or claimed in combination with any feature of any other drawing.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of galvanic isolation for a gate-controlled device comprising:
   receiving, by the gate-controlled device, a wirelessly transmitted control signal transmitted by a main control card, wherein said control signal is wirelessly received by a wireless receiver connected to the gate-controlled device;
   transmitting, by the gate controlled device, a wireless transmit signal to the main control card, wherein said wireless transmit signal is transmitted by a wireless transmitter connected to the gate-controlled device; and
   controlling the gate-controlled device based, at least in part, on the control signal;
   wherein the wireless receiver provides galvanic isolation of the gate-controlled device from the main control card.

2. The method of claim 1, wherein the gate-controlled device includes an insulated gate bipolar transistor (IGBT), injection-enhanced gate transistor (IEGT), silicon controlled rectifier (SCR), gate turn off (GTO) thyristor, gate controlled thyristor (GCT), integrated gate commutated thyristor (IGCT), or metal-oxide semiconductor field effect transistor (MOSFET).

3. The method of claim 1, wherein the control signal is received by the wireless receiver utilizing digital wireless technology.

4. The method of claim 3, wherein the digital wireless technology comprises code division multiple access (CDMA).

5. The method of claim 1, wherein the wireless transmit signal comprises one or more of voltage sensing, temperature sensing, current sensing or desaturation sensing signals.

6. The method of claim 1, wherein the wireless transmit signal is transmitted to the main control card having a wireless receiver.

7. The method of claim 6, wherein the wireless transmit signal is transmitted to the main control card having a wireless transceiver utilizing digital wireless technology.

8. The method of claim 7, wherein the digital wireless technology comprises code division multiple access (CDMA).

9. An apparatus comprising:
- an insulated gate bipolar transistor (IGBT); and
- a wireless transceiver connected to the IGBT, said wireless transceiver configured to:
    - receive wireless control signals from a main control card; and
    - transmit wireless transmit signals to the main control card, wherein said wireless transceiver provides galvanic isolation of the IGBT from the main control card;
- wherein the IGBT is controlled based, at least in part, on the wireless control signals.

10. The apparatus of claim 9, wherein the wireless control signals are received from the main control card having a wireless transceiver and wherein the wireless transmit signals are transmitted to the wireless transceiver on the main control card.

11. The apparatus of claim 9, wherein the wireless transceiver associated with the IGBT utilizes digital wireless technology.

12. The apparatus of claim 11, wherein the digital wireless technology comprises code division multiple access (CDMA).

13. The apparatus of claim 9, wherein the wireless transmit signals comprise one or more of voltage sensing, temperature sensing, current sensing or desaturation sensing signals.

14. A system of galvanic isolation for a gate-controlled device comprising:
- at least one gate-controlled device;
- a first wireless transceiver connected to the at least one gate-controlled device;
- a main control card; and
- a second wireless transceiver connected to the main control card, wherein wireless control signals transmitted by the second wireless transceiver from the main control card are received by the first wireless transceiver and used to control the gate-controlled device and wherein wireless transmit signals are transmitted by the first wireless transceiver and received by the second wireless transceiver;
- wherein the first wireless transceiver provides galvanic isolation of the at least on gate-controlled device from the main control card.

15. The system of claim 14, wherein the gate-controlled device includes an insulated gate bipolar transistor (IGBT), injection-enhanced gate transistor (IEGT), silicon controlled rectifier (SCR), gate turn off (GTO) thyristor, gate controlled thyristor (GCT), integrated gate commutated thyristor (IGCT), or metal-oxide semiconductor field effect transistor (MOSFET).

16. The system of claim 14, further comprising a power generation system, wherein the at least one gate-controlled device is used within the power generation system.

17. The system of claim 14, wherein the first wireless transceiver and the second wireless transceiver transmit and receive signals using digital wireless technology including code division multiple access (CDMA).

* * * * *